(12) United States Patent
Tsai et al.

(10) Patent No.: US 8,725,105 B2
(45) Date of Patent: May 13, 2014

(54) LOW NOISE AMPLIFIER AND SAW-LESS RECEIVER WITH LOW-NOISE AMPLIFIER

(71) Applicant: Mediatek Inc., Hsin-Chu (TW)

(72) Inventors: Ming-Da Tsai, Miaoli County (TW); Chih-Fan Liao, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/798,097

(22) Filed: Mar. 13, 2013

(65) Prior Publication Data

US 2013/0314160 A1    Nov. 28, 2013

Related U.S. Application Data

(60) Provisional application No. 61/651,495, filed on May 24, 2012.

(51) Int. Cl.
*H04B 1/16*   (2006.01)
*H03F 3/45*   (2006.01)

(52) U.S. Cl.
USPC ......... 455/341; 455/232.1; 330/253; 330/260

(58) Field of Classification Search
USPC ............... 455/232.1, 296, 334, 341; 330/252, 330/253, 254, 260, 277, 278, 291; 375/345, 375/346
See application file for complete search history.

(56) References Cited

U.S. PATENT DOCUMENTS

| | | | |
|---|---|---|---|
| 7,299,021 B2 | 11/2007 | Parssinen | |
| 7,372,925 B2 | 5/2008 | Pipilos | |
| 7,697,914 B2 * | 4/2010 | Rofougaran | 455/305 |
| 7,701,292 B2 | 4/2010 | Lin | |
| 7,702,306 B2 | 4/2010 | McMullin | |
| 7,843,270 B2 | 11/2010 | Li | |
| 7,873,342 B2 | 1/2011 | Lim | |
| 7,944,298 B2 * | 5/2011 | Cabanillas et al. | 330/253 |
| 8,045,943 B2 * | 10/2011 | Kaczman et al. | 455/326 |
| 8,203,388 B2 * | 6/2012 | Kathiresan et al. | 330/311 |
| 2005/0143020 A1 | 6/2005 | Ren | |
| 2008/0136521 A1 | 6/2008 | Chang | |
| 2008/0214135 A1 | 9/2008 | Muhammad | |
| 2008/0242252 A1 | 10/2008 | Youssoufian | |
| 2009/0022210 A1 | 1/2009 | Matsumoto | |
| 2009/0102980 A1 | 4/2009 | Huang | |
| 2009/0170461 A1 | 7/2009 | Kwon | |

(Continued)

FOREIGN PATENT DOCUMENTS

EP   0797873 B1   8/2004

OTHER PUBLICATIONS

Balankutty et al., An Ultra-Low Voltage, Low-Noise, High Linearity 900-MHz Receiver With Digitally Calibrated In-Band Feed-Forward Interferer Cancellation in 65-nm CMOS, 2011.

(Continued)

*Primary Examiner* — Quochien B Vuong
(74) *Attorney, Agent, or Firm* — Winston Hsu; Scott Margo (57) ABSTRACT

A low noise amplifier is used to amplify a differential input pair to generate a differential output pair. The low noise amplifier includes two main paths, two assistant circuits and two adders to make noise carried on two output signals of the differential output pair be the same; therefore, the noise of the two output signals can be fully cancelled in the following operations.

20 Claims, 7 Drawing Sheets

(56) References Cited

U.S. PATENT DOCUMENTS

| | | |
|---|---|---|
| 2010/0056094 A1 | 3/2010 | Yang |
| 2011/0051670 A1 | 3/2011 | Safarian |
| 2011/0105067 A1 | 5/2011 | Wilson |
| 2011/0193635 A1 | 8/2011 | Zeng |
| 2011/0267144 A1 | 11/2011 | Behera |

OTHER PUBLICATIONS

Murphy et al., A blocker-tolerant wideband noise-cancelling receiver with a 2dB noise figure, p. 74-75 and figure 4.1.7, 2012.

* cited by examiner

LOW NOISE AMPLIFIER AND SAW-LESS RECEIVER WITH LOW-NOISE AMPLIFIER

CROSS REFERENCE TO RELATED APPLICATIONS

This application claims the priority of U.S. Provisional Application No. 61/651,495, filed May 24, 2012, which is included herein by reference in its entirety.

BACKGROUND

In cellular communication, large blockers are present at a receiver along with the desired signals. These strong blockers may induce a large voltage swing in the receiver which can cause problems for circuit operations; therefore, the receiver has a SAW filter at the front end to filter out the large blockers. To lower the cost of the receiver, a SAW-less receiver (i.e. a receiver which does not include the SAW filter) has been developed. The SAW-less receiver still needs a passive filter to filter out the strong blockers. Therefore, how to decrease a chip area of the passive filter of the receiver, and maintain a linearity of the SAW-less receiver is an important topic in this field.

SUMMARY

It is therefore an objective of the present invention to provide a low noise amplifier, and a SAW-less receiver with the low noise amplifier to solve the above-mentioned problems.

According to one embodiment of the present invention, a low noise amplifier comprises a first Gm cell, a second Gm cell, a first assistant circuit, a second assistant circuit, a first adder and a second adder. The first Gm cell is used for receiving a first input signal to generate a first processed signal, and the second Gm cell is used for receiving a second input signal to generate a second processed signal, wherein the first input signal and the second input signal are a differential input pair of the low noise amplifier. The first assistant circuit is used for receiving the first input signal to generate a first assistant signal; the second assistant circuit is used for receiving the second input signal to generate a second assistant signal; the first adder is coupled to the first Gm cell and the second assistant circuit, and is used for summing up the first processed signal and the second assistant signal to generate a first output signal; and the second adder is coupled to the second Gm cell and the first assistant circuit, and is used for summing up the second processed signal and the first assistant signal to generate a second output signal, wherein the first output signal and the second output signal are a differential output pair of the low noise amplifier.

According to another embodiment of the present invention, a low noise amplifier comprises a first Gm cell, a second Gm cell, a first assistant circuit, a second assistant circuit, four mixers, a first adder and a second adder. The first Gm cell is used for receiving a first input signal to generate a first processed signal, and the second Gm cell is for receiving a second input signal to generate a second processed signal, wherein the first input signal and the second input signal are a differential input pair of the low noise amplifier. The first assistant circuit is used for receiving the first input signal to generate a first assistant signal; the second assistant circuit is used for receiving the second input signal to generate a second assistant signal; the four mixers are coupled to the first Gm cell, the second Gm cell, the first assistant circuit and the second assistant circuit, and are used for mixing the first processed signal, the second processed signal, the first assistant signal and the second assistant signal with a oscillation signal to generate a mixed first processed signal, a mixed second processed signal, a mixed first assistant signal and a mixed second assistant signal, respectively; the first adder is used for summing up the mixed first processed signal and the mixed second assistant signal to generate a first output signal; and the second adder is used for summing up the mixed second processed signal and the mixed first assistant signal to generate a second output signal, wherein the first output signal and the second output signal are a differential output pair of the low noise amplifier.

According to another embodiment of the present invention, a SAW-less receiver comprises a low noise amplifier and a detect and control circuit, where the low noise amplifier comprises a first Gm cell, a second Gm cell, a first assistant circuit, a second assistant circuit, a first adder and a second adder. In the operations of the SAW-less receiver, the first Gm cell is used for receiving a first input signal to generate a first processed signal, and the second Gm cell is used for receiving a second input signal to generate a second processed signal, wherein the first input signal and the second input signal are a differential input pair of the low noise amplifier. The first assistant circuit is used for receiving the first input signal to generate a first assistant signal; the second assistant circuit is used for receiving the second input signal to generate a second assistant signal; the first adder is coupled to the first Gm cell and the second assistant circuit, and is used for summing up the first processed signal and the second assistant signal to generate a first output signal; and the second adder is coupled to the second Gm cell and the first assistant circuit, and is used for summing up the second processed signal and the first assistant signal to generate a second output signal, wherein the first output signal and the second output signal are a differential output pair of the low noise amplifier. In addition, the detect and control circuit is used for detecting a blocker exists in the differential input pair to generate at least one control signal which is configured to enable or disable the first assistant circuit and the second assistant circuit.

According to another embodiment of the present invention, a SAW-less receiver comprises a low noise amplifier and a detect and control circuit, where the low noise amplifier comprises a first Gm cell, a second Gm cell, a first assistant circuit, a second assistant circuit, four mixers, a first adder and a second adder. The first Gm cell is used for receiving a first input signal to generate a first processed signal, and the second Gm cell is for receiving a second input signal to generate a second processed signal, wherein the first input signal and the second input signal are a differential input pair of the low noise amplifier. The first assistant circuit is used for receiving the first input signal to generate a first assistant signal; the second assistant circuit is used for receiving the second input signal to generate a second assistant signal; the four mixers are coupled to the first Gm cell, the second Gm cell, the first assistant circuit and the second assistant circuit, and are used for mixing the first processed signal, the second processed signal, the first assistant signal and the second assistant signal with a oscillation signal to generate a mixed first processed signal, a mixed second processed signal, a mixed first assistant signal and a mixed second assistant signal, respectively; the first adder is used for summing up the mixed first processed signal and the mixed second assistant signal to generate a first output signal; and the second adder is used for summing up the mixed second processed signal and the mixed first assistant signal to generate a second output signal, wherein the first output signal and the second output signal are a differential output pair of the low noise amplifier. In addition, the detect and control circuit is used for detecting a blocker exists in the differential input pair to generate at least one control signal which is configured to enable or disable the first assistant circuit and the second assistant circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
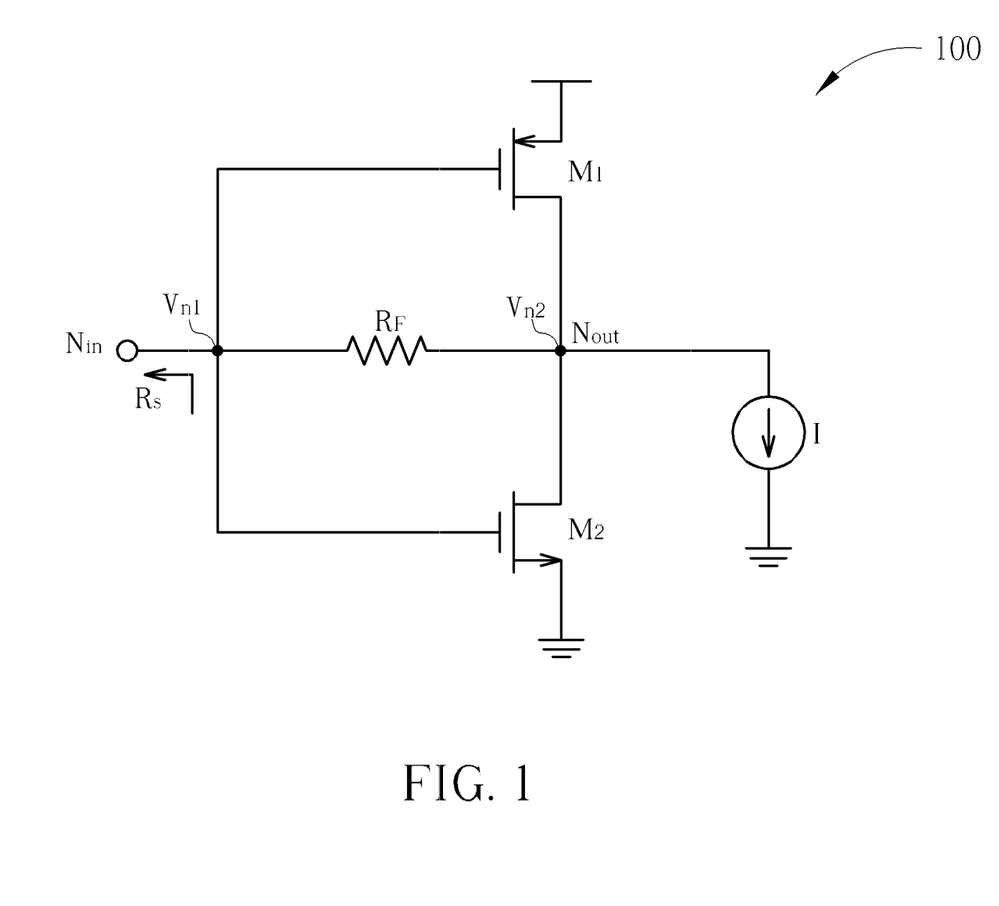
FIG. 1 is a diagram of an inverter with a feedback loop.

Please refer to FIG. 1, which is a diagram of an inverter 100 with a feedback loop. Referring to FIG. 1, the inverter 100 includes an input node $N_{in}$, two transistors $M_1$ and $M_2$, a feedback resistor $R_F$ and an output node $N_{out}$, where the output node $N_{out}$ is connected to a current source I provided by the following transistors (not shown). In the inverter 100, a noise $V_{n1}$ at the input node $N_{in}$ and a noise $V_{n2}$ at the output node $N_{out}$ have a relationship as follows:

$$V_{n2}/V_{n1}=(Rs+R_F)/Rs \sim R_F/Rs;$$

where Rs is an source resistance of the inverter 100, and the source resistance Rs could be much smaller than the resistance of the feedback resistor $R_F$.

In addition, in the input match condition, the above formula can be presented as follows:

$$V_{n2}/V_{n1} \sim (gm1+gm2)*ro;$$

where gm1 and gm2 are the transconductances of the transistors M1 and M2, respectively, and ro is an output resistance.

Therefore, the noise $V_{n1}$ and the noise $V_{n2}$ have a predictable relationship, and this concept can be used in the noise cancellation technique in the receiver of the present invention.

Figure 2:
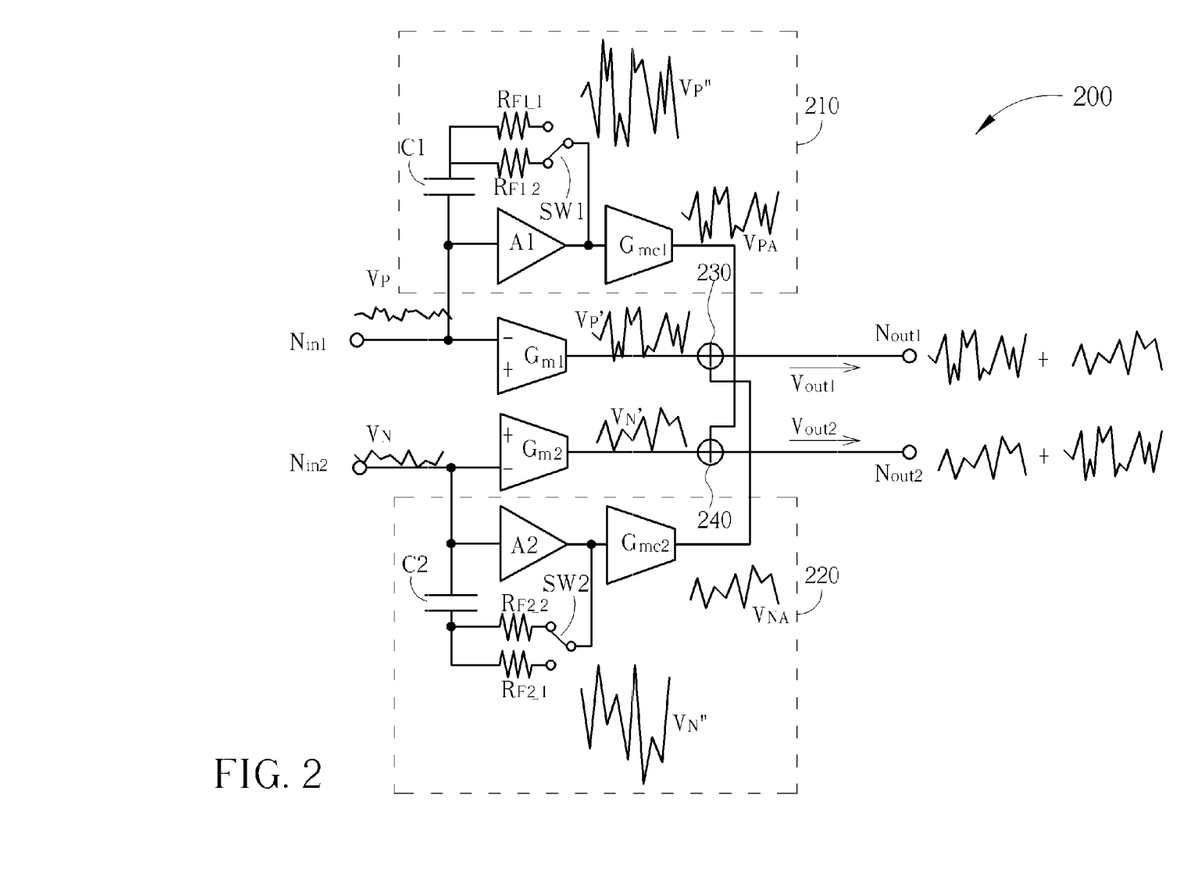
FIG. 2 is a diagram illustrating a low noise amplifier according to one embodiment of the present invention.

Please refer to FIG. 2, which is a diagram illustrating a low noise amplifier (LNA) 200 according to one embodiment of the present invention, where the LNA 200 is an inductor-less LNA and can be used in a SAW-less receiver (please note this is not a limitation of the present invention). As shown in FIG. 2, the LNA 200 includes two input terminals $N_{in1}$ and $N_{in2}$, a first transconductance cell (Gm cell) Gm1, a second Gm cell Gm2, a first assistant circuit 210, a second assistant circuit 220, two adders 230 and 240, and two output terminals $N_{out1}$ and $N_{out2}$, where the first assistant circuit 210 includes a first amplifier A1 with a feedback loop including a capacitor C1, two feedback resistors $R_{F1\_1}$ and $R_{F1\_2}$ and a switch SW1, and a first assistant Gm cell Gmc1; and the second assistant circuit 220 includes a second amplifier A2 with a feedback loop including a capacitor C2, two feedback resistors $R_{F2\_1}$ and $R_{F2\_2}$ and a switch SW2, and a second assistant Gm cell Gmc2.

The feedback loop of the first amplifier A1 and the feedback loop of the second amplifier A2 are used to adjust the equivalent input resistances of the LNA 200. For example, the feedback loop of the first amplifier A1 can be controlled by switching the switch SW1 to make the feedback loop have a resistance of the resistor $R_{F1\_1}$ or the resistor $R_{F1\_2}$. When the LNA 200 is applied to an adaptive receiver, switching the switch SW1 can provide an appropriate impedance for input impedance matching, and switching the switch SW1 can also change the relationship between the noise at an input node of the first amplifier A1 and the noise at an output node of the first amplifier A1. Similarly, the feedback loop of the first amplifier A2 can be controlled by switching the switch SW2 to make the feedback loop have a resistance of the resistor $R_{F2\_1}$ or the resistor $R_{F2\_2}$. When the LNA 200 is applied to an adaptive receiver, switching the switch SW2 can provide an appropriate impedance for input impedance matching, and switching the switch SW2 can also change the relationship between the noise at an input node of the first amplifier A2 and the noise at an output node of the first amplifier A2. The embodiment in FIG. 2 illustrates the equivalent input resistances of the LNA 200 can be controlled by using the switchable resistors, however, it is not meant to be a limitation of the present invention. In other embodiments, the equivalent input resistances of the LNA 200 can also be adjusted by adjusting the gains of the amplifiers A1 and A2, such as by adjusting bias of the amplifiers A1, A2 to change the gains, or by switching the device sizes of the amplifiers A1, A2 to change the gains. These alternative designs shall fall within the scope of the present invention.

In the operations of the LNA 200, in a first channel, the first Gm cell Gm1 receives a first input signal $V_P$ to generate a first processed signal $V_P'$; simultaneously, the first amplifier A1 amplifies the first input signal $V_P$ to generate an amplified first input signal $V_P''$, and the first assistant Gm cell Gmc1 receives the amplified first input signal $V_P''$ to generate a first assistant signal $V_{PA}$. In addition, in a second channel, the second Gm cell Gm2 receives a second input signal $V_N$ (the second input signal $V_N$ and the first input signal $V_P$ are a differential input pair) to generate a second processed signal $V_N'$; simultaneously, the second amplifier A2 amplifies the second input signal $V_N$ to generate an amplified second input signal $V_N''$, and the second assistant Gm cell Gmc2 receives the amplified second input signal $V_N''$ to generate a second assistant signal $V_{NA}$.

Then, the adder 230 sums up the first processed signal $V_P'$ and the second assistant signal $V_{NA}$ to generate a first output signal $V_{out1}$ to the output terminal $N_{out1}$, and the adder 240 sums up the second processed signal $V_N'$ and the first assistant signal $V_{PA}$ to generate a second output signal $V_{out2}$ to the output terminal $N_{out2}$, where the first output signal $V_{out1}$ and the second output signal $V_{out2}$ are a differential output pair of the LNA 200.

In addition, the waves shown in FIG. 2 are used to represent noise of the signals $V_P$, $V_P'$, $V_P''$, $V_{PA}$, $V_{out1}$, $V_N$, $V_N'$, $V_N''$, $V_{NA}$, $V_{out2}$. Taking the first channel as an example, and referring to the concept mentioned with regards to FIG. 1, the ratio of the noise of the first processed signal $V_P'$ and the noise of the amplified first input signal $V_P''$ can be predicted by the designer by referring to parameters of the first amplifier A1; therefore, the gain of the first Gm cell Gm1 and the gain of the first assistant Gm cell Gmc1 can be designed to make the noise of the first assistant signal $V_{PA}$ be equal to the noise of the first processed signal $V_P'$. Similarly, in the second channel, the gain of the second assistant Gm cell Gmc2 can be designed to make the noise of the second assistant signal $V_{NA}$ be equal to the noise of the second processed signal $V_N'$.

As the noise of the first assistant signal $V_{PA}$ is the same as the noise of the first processed signal $V_P'$, and the noise of the second assistant signal $V_{NA}$ is the same as the noise of the second processed signal $V_N'$, the noise of the first output signal $V_{out1}$ should be the same as the noise of the second output signal $V_{out2}$. In addition, because the first output signal $V_{out1}$ and the second output signal $V_{out2}$ are a differential output pair (that is, the required data is obtained by subtracting first output signal $V_{out1}$ from the second output signal $V_{out2}$), the noise can be fully cancelled in the following operation.

In this embodiment, the first Gm cell Gm1, the second Gm cell Gm2, the first assistant Gm cell Gmc1 and the second assistant Gm cell Gmc2 are all scalable; that is, the gains of the first Gm cell Gm1, the second Gm cell Gm2, the first assistant Gm cell Gmc1 and the second assistant Gm cell Gmc2 can be varied under different conditions. For example, the gains of the first Gm cell Gm1 and the second Gm cell Gm2 can be adjusted by considering the strengths of the input signals, and the gains of the first assistant Gm cell Gmc1 and the second assistant Gm cell Gmc2 are adjusted by referring to the gains of the first Gm cell Gm1 and the second Gm cell Gm2. When the LNA 200 requires a higher linearity, the first assistant Gm cell Gmc1 and the second assistant Gm cell Gmc2 can be disabled to make the first assistant circuit 210 and second assistant circuit 220 not output the signals to the adders 230 and 240, respectively.

Figure 3:
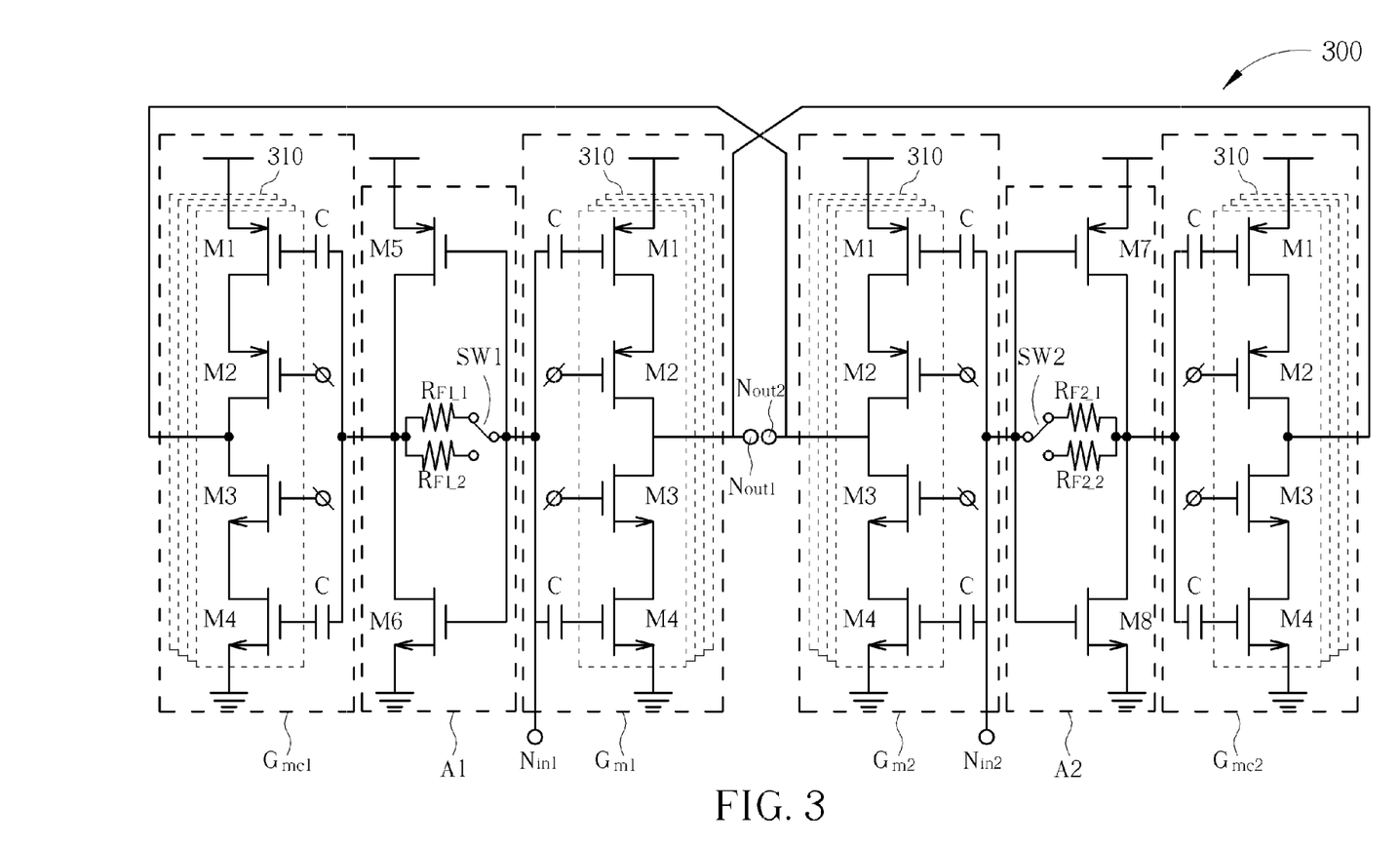
FIG. 3 is a diagram illustrating a circuit for implementing the LNA shown in FIG. 2 according to one embodiment of the present invention.

Please refer to FIG. 3, which is a diagram illustrating a circuit 300 for implementing the LNA 200 shown in FIG. 2 according to one embodiment of the present invention. Referring to FIG. 3, each of the first Gm cell Gm1, the second Gm cell Gm2, the first assistant Gm cell Gmc1 and the second assistant Gm cell Gmc2 is implemented by a plurality of Gm sub-cells 310 connected in parallel and two capacitors C, where each of the Gm sub-cells 310 is a common source amplifier including transistors M1-M4. In this embodiment, the Gm sub-cells 310 of the first Gm cell Gm1, the second Gm cell Gm2, the first assistant Gm cell Gmc1 and the second assistant Gm cell Gmc2 are the same; that is, each of the Gm sub-cells 310 of the first assistant Gm cell Gmc1 is a replica of the each of the Gm sub-cells 310 of the first Gm cell Gmc1, the second Gm cell Gm2 and the second assistant Gm cell Gmc2. These same Gm sub-cell structures have a good transconductance matching between the Gm cells Gm1, Gmc1, Gm2 and Gmc2.

The gains of the of the first Gm cell Gm1, the second Gm cell Gm2, the first assistant Gm cell Gmc1 and the second assistant Gm cell Gmc2 can be adjusted by using control signals φ to enable or disable the Gm sub-cells 310.

In addition, refer to FIG. 2 and FIG. 3, in the circuit 300 for implementing the LNA 200, a connection (or a node) is used to implement the adder 230/240 to combine the currents from the Gm cells. That is, the adders 230 and 240 shown in FIG. 3 can be just a connection to have the adding function, and may not be implemented by a specific circuit.

In the first assistant circuit 210 and the second assistant circuit 220, the feedback resistors ($R_{F1\_1}$, $R_{F1\_2}$, $R_{F2\_1}$ and $R_{F2\_2}$) to be used can be controlled by switching the switches SW1 and SW2, respectively.

Figure 4:
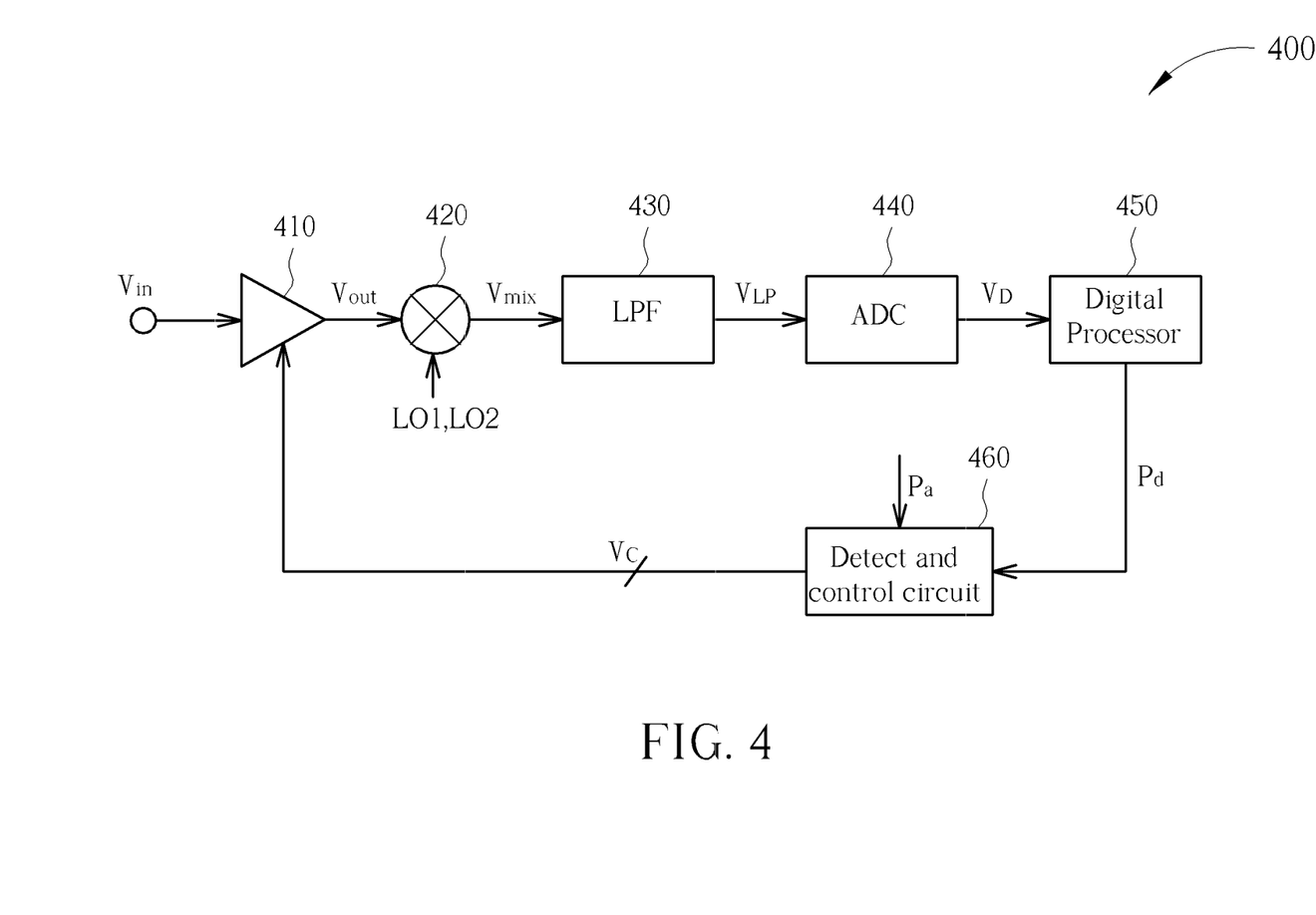
FIG. 4 is a diagram illustrating a SAW-less receiver according to one embodiment of the present invention.

Please refer to FIG. 4, which is a diagram illustrating a SAW-less receiver 400 according to one embodiment of the present invention. Referring to FIG. 4, the SAW-less receiver 400 comprises a LNA 410, a mixer 420, a low-pass filter (LPF) 430, an analog-to-digital converter (ADC) 440, a digital processor 450 and a detect and control circuit 460, where the LNA 410 can be implemented by the LNA 200 shown in FIG. 2.

In the operations of the SAW-less receiver 400, the LNA 410 amplifies a differential input pair $V_{in}$ to generate a differential output pair $V_{out}$, the mixer 420 mixes the differential output pair $V_{out}$ with oscillation signals LO1 and LO2 (the LO1 and LO2 may be 0 degree and 180 degree, respectively) to generate a mixed differential output pair $V_{mix}$, the LPF 430 filters the mixed differential output pair $V_{mix}$ to generate a filtered signal $V_{LP}$, and the ADC 440 performs an analog-to-digital converting operation upon the filtered signal $V_{LP}$ to generate a digital signal $V_D$ to the digital processor 450.

The digital processor 450 can detect the power of the in-band signal of the digital signal $V_D$ at the digital domain and send the information $P_d$ of the power of the in-band signal to the detect and control circuit 460. The detect and control circuit 460 can generate at least one control signal Vc to control the gains of the Gm cells Gm1 and Gm2 according to the information $P_d$ of the power of the in-band signal. If the power of the in-band signal is too low, the detect and control circuit 460 generates the control signal Vc to increase the gains of the Gm cells Gm1 and Gm2 shown in FIG. 2; and if the power of the in-band signal is too high, the detect and control circuit 460 generates the control signal Vc to decrease the gains of the Gm cells Gm1 and Gm2. In addition, when the Gm cells Gm1 and Gm2 are adjusted, the detect and control circuit 460 also generates another control signal Vc to adjust the gains of the assistant Gm cells Gmc1 and Gmc2 to make the noise of the first assistant signal $V_{PA}$ be equal to the noise of the first processed signal $V_P'$, and to make the noise of the second assistant signal $V_{NA}$ be equal to the noise of the second processed signal $V_N'$ as shown in FIG. 2.

When the differential input pair $V_{in}$ includes blocker(s), the amplifiers A1 and A2 may be saturated and the linearity of the receiver will be worsened. Therefore, the detect and control circuit 460 also detects an out-band power $P_a$ in the analog domain to determine whether the differential input pair $V_{in}$ includes the blocker. For example, the detect and control circuit 460 can detect the power of the differential input pair $V_{in}$, the differential output pair $V_{out}$ or the mixed differential output pair $V_{mix}$ to determine whether the blocker exists in these signals. When the blocker exists in the differential input pair, the detect and control circuit 460 generates the control signal Vc to disable the first assistant circuit 210 and the second assistant circuit 220 (i.e. disable the assistant Gm cells Gmc1 and Gmc2); and when the blocker does not exist in the differential input pair, the detect and control circuit 460 generates the control signal Vc to enable the first assistant circuit 210 and the second assistant circuit 220 (i.e. enable the assistant Gm cells Gmc1 and Gmc2).

In addition, in another embodiment of the present invention, the detect and control circuit 460 can detect a strength of the blocker to generate a detection result, and uses the detection result to generate the control signal Vc to enable or disable the first assistant circuit 210 and the second assistant circuit 220. For example, when the strength/power of the blocker is great (e.g. greater than a threshold), the detect and control circuit 460 generates the control signal Vc to disable the first assistant circuit 210 and the second assistant circuit 220 (i.e. disable the assistant Gm cells Gmc1 and Gmc2); and when strength/power of the blocker is low (e.g. lower than a threshold), the detect and control circuit 460 generates the control signal Vc to enable the first assistant circuit 210 and the second assistant circuit 220 (i.e. enable the assistant Gm cells Gmc1 and Gmc2).

In light of the above, when there is no blocker along with the differential input pair $V_{in}$ or the strength of the blocker is low, the first assistant circuit 210 and the second assistant circuit 220 of the LNA 200/410 are enabled to perform the noise cancellation technique to improve the signal-to-noise ratio (SNR); and when there is a blocker along with the differential input pair $V_{in}$ or the strength of the blocker is great, the first assistant circuit 210 and the second assistant circuit 220 of the LNA 200/410 are disabled to maintain the linearity of the SAW-less receiver 400. Therefore, the SAW-less receiver 400 can always operate appropriately.

Figure 5:
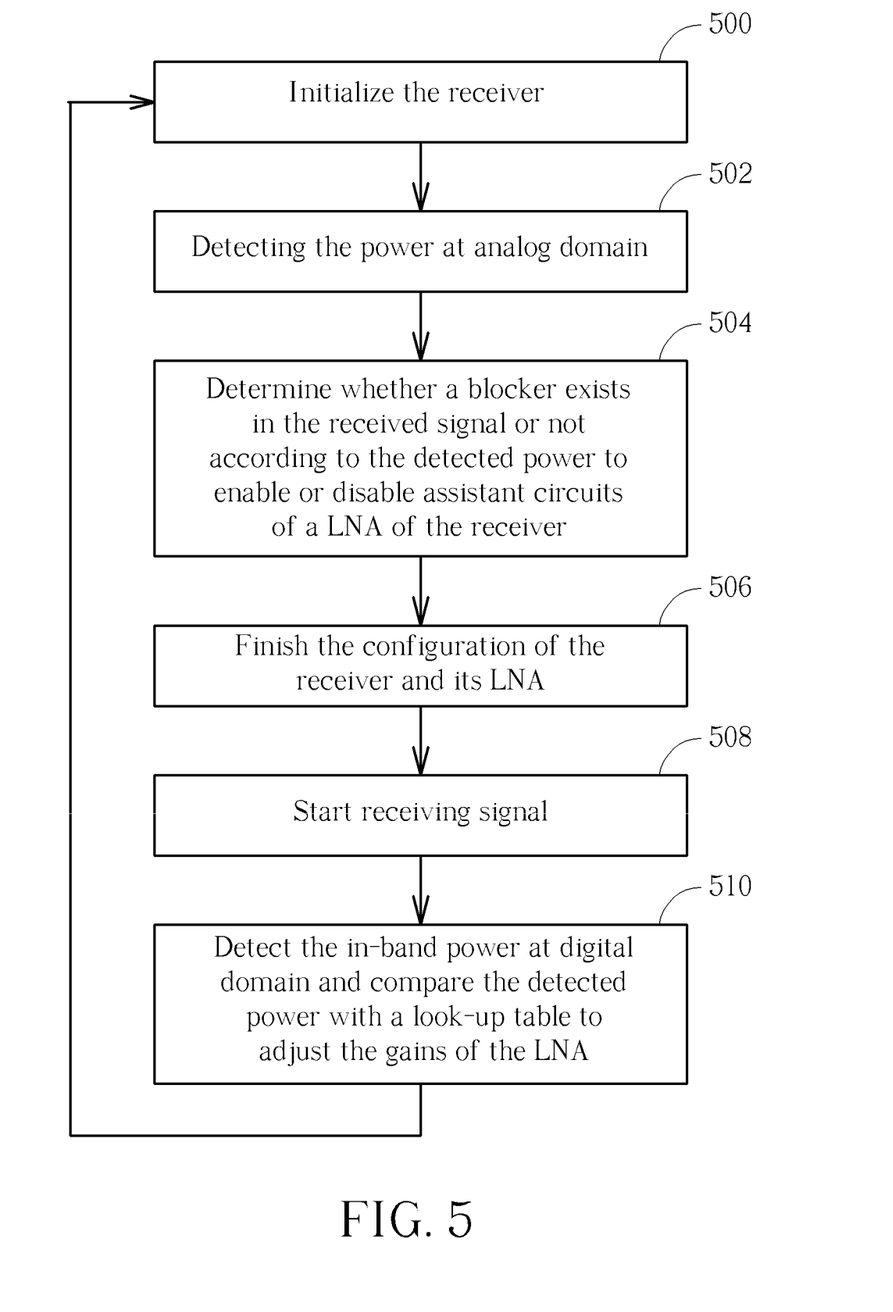
FIG. 5 is a flowchart of a controlling method of the SAW-less receiver shown in FIG. 4 according to one embodiment of the present invention.

Please refer to FIG. 5, which is a flowchart of a controlling method of the SAW-less receiver 400 shown in FIG. 4 according to one embodiment of the present invention. Referring to FIG. 2, FIG. 4 and FIG. 5 and the above-mentioned disclosure, the flow is described as follows:

Step 500: Initialize the receiver.

Step 502: Detect the power in the analog domain.

Step 504: Determine whether a blocker exists in the received signal or not according to the detected power to enable or disable assistant circuits of a LNA of the receiver.

Step 506: Finish the configuration of the receiver and its LNA.

Step 508: Start receiving signal.

Step 510: Detect the in-band power in the digital domain and compare the detected power with a look-up table to adjust the gains of the LNA.

The flow then goes back to Step 500 to initialize the receiver for a next receiving cycle.

Figure 6:
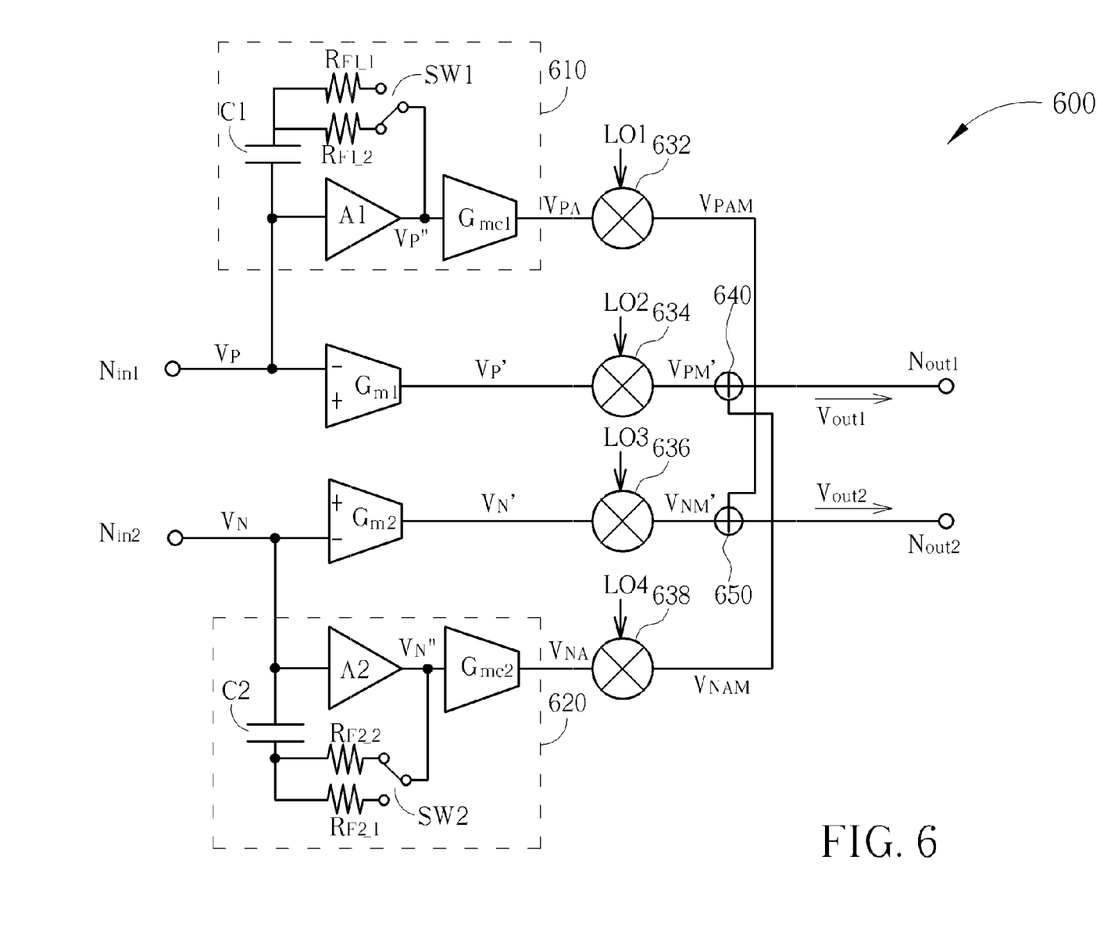
FIG. 6 is a diagram illustrating a low noise amplifier according to another embodiment of the present invention.

Please refer to FIG. 6, which is a diagram illustrating a low-noise amplifier (LNA) 600 according to another embodiment of the present invention, where the LNA 200 is an inductor-less LNA and can be used in a SAW-less receiver (please note this is not a limitation of the present invention). As shown in FIG. 6, the LNA 600 includes two input terminals $N_{in1}$ and $N_{in2}$, a first Gm cell Gm1, a second Gm cell Gm2, a first assistant circuit 610, a second assistant circuit 620, for mixers 632, 634, 636 and 638, two adders 640 and 650, and two output terminals $N_{out1}$ and $N_{out2}$, where the first assistant circuit 610 includes a first amplifier A1 with a feedback loop including a capacitor C1, two feedback resistors $R_{F1\_1}$ and $R_{F1\_2}$ and a switch SW1, and a first assistant Gm cell Gmc1; and the second assistant circuit 620 includes a second amplifier A2 with a feedback loop including a capacitor C2, two feedback resistors $R_{F2\_1}$ and $R_{F2\_2}$ and a switch SW2, and a second assistant Gm cell Gmc2.

In the operations of the LNA 200, in a first channel, the first Gm cell Gm1 receives a first input signal $V_P$ to generate a first processed signal $V_P'$, and simultaneously the first amplifier A1 amplifies the first input signal $V_P$ to generate an amplified first input signal $V_P''$, and the first assistant Gm cell Gmc1 receives the amplified first input signal $V_P''$ to generate a first assistant signal $V_{PA}$. In addition, in a second channel, the second Gm cell Gm2 receives a second input signal $V_N$ (the second input signal $V_N$ and the first input signal $V_P$ are a differential input pair) to generate a second processed signal $V_N'$, and simultaneously the second amplifier A2 amplifies the second input signal $V_N$ to generate an amplified second input signal $V_N''$, and the second assistant Gm cell Gmc2 receives the amplified second input signal $V_N''$ to generate a second assistant signal $V_{NA}$.

Then, the first assistant signal $V_{PA}$, the first processed signal $V_P'$, the second processed signal $V_N'$ and the second assistant signal $V_{NA}$ are mixed with four oscillation signals LO1~LO4 (LO1-LO4 may be 0 degree, 0 degree, 180 degree and 180 degree, respectively) by the mixers 632, 634, 636 and 638, respectively, to generate a mixed first assistant signal $V_{PAM}$, a mixed first processed signal $V_{PM}'$, a mixed second processed signal $V_{NM}'$ and a mixed second assistant signal $V_{NAM}$.

The adder 640 sums up mixed first processed signal $V_{PM}'$ and the mixed second assistant signal $V_{NAM}$ to generate a first output signal Vout1 to the output terminal $N_{out1}$, and the adder 650 sums up the mixed second processed signal $V_{NM}'$ and the mixed first assistant signal $V_{PAM}$ to generate a second output signal $V_{out2}$ to the output terminal Nout2, where the first output signal $V_{out1}$ and the second output signal $V_{out2}$ are a differential output pair of the LNA 600.

Similar to the LNA 200 shown in FIG. 2, in the LNA 600 shown in FIG. 6, the ratio of the noise of the first processed signal $V_P'$ and the noise of the amplified first input signal $V_P''$ can be predicted by the designer by referring to parameters of the first amplifier A1; therefore, the gain of the first Gm cell Gm1 and the gain of the first assistant Gm cell Gmc1 can be designed to make the noise of the first assistant signal $V_{PA}$ be equal to the noise of the first processed signal $V_P'$. Similarly, in the second channel, the gain of the second assistant Gm cell Gmc2 can be designed to make the noise of the second assistant signal $V_{NA}$ be equal to the noise of the second processed signal $V_N'$.

As the noise of the first assistant signal $V_{PA}$ is the same as the noise of the first processed signal $V_P'$, and the noise of the second assistant signal $V_{NA}$ is the same as the noise of the second processed signal $V_N'$, the noise of the mixed first assistant signal $V_{PAM}$ should be the same as the noise of the mixed first processed signal $V_{PM}'$, and the noise of the mixed second assistant signal $V_{NAM}$ should be the same as the noise of the mixed second processed signal $V_{NM}'$. Therefore, the noise of the first output signal $V_{out1}$ is the same as the noise of the second output signal $V_{out2}$. In addition, because the first output signal $V_{out1}$ and the second output signal $V_{out2}$ are a differential output pair (that is, the required data is obtained by subtracting first output signal $V_{out1}$ from the second output signal $V_{out2}$), the noise can be fully cancelled in the following operation.

In this embodiment, the first Gm cell Gm1, the second Gm cell Gm2, the first assistant Gm cell Gmc1 and the second assistant Gm cell Gmc2 are all scalable; that is, the gains of the first Gm cell Gm1, the second Gm cell Gm2, the first assistant Gm cell Gmc1 and the second assistant Gm cell Gmc2 can be varied under different conditions. For example, the gains of the first Gm cell Gm1 and the second Gm cell Gm2 can be adjusted by considering the strengths of the input signals, the gains of the first assistant Gm cell Gmc1 and the second assistant Gm cell Gmc2 are adjusted by referring to the gains of the first Gm cell Gm1 and the second Gm cell Gm2. When the LNA 200 requires a higher linearity, the first assistant Gm cell Gmc1 and the second assistant Gm cell Gmc2 can be disabled to make the first assistant circuit 610 and second assistant circuit 620 not output the signals to the adders 630 and 640, respectively.

The circuit implementation of the LNA 600 can be obtained by adding four mixers into the circuit 300 shown in FIG. 3. Because a person skilled in this art should understand how to modify the circuit 300 in order to implement the LNA 600, further descriptions are omitted here.

Figure 7:
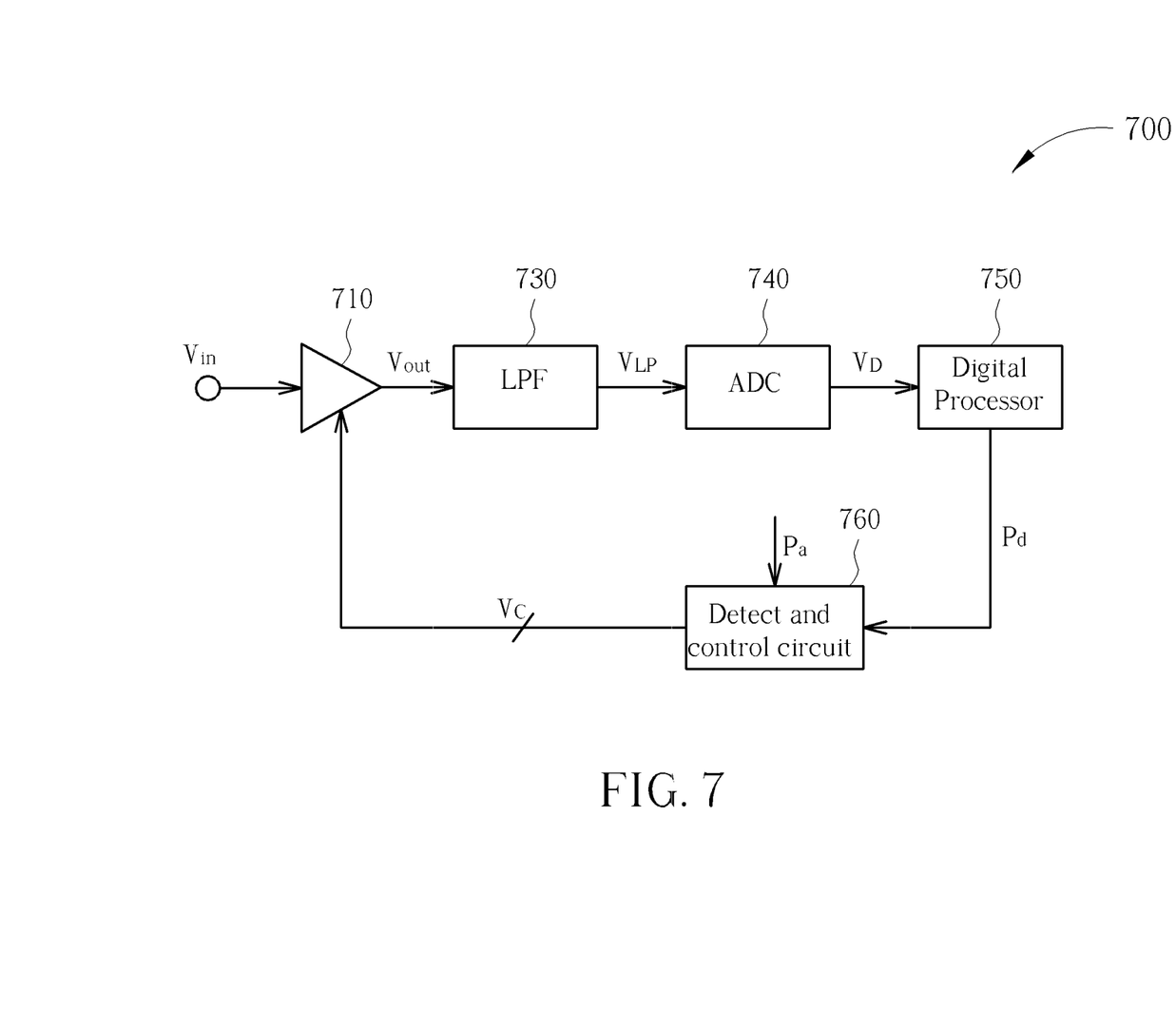
FIG. 7 is a diagram illustrating a SAW-less receiver according to another embodiment of the present invention.

Please refer to FIG. 7, which is a diagram illustrating a SAW-less receiver 700 according to another embodiment of the present invention. Referring to FIG. 7, the SAW-less receiver 700 comprises a LNA 710, a low-pass filter (LPF) 730, an analog-to-digital converter (ADC) 740, a digital processor 750 and a detect and control circuit 760, where the LNA 710 can be implemented by the LNA 600 shown in FIG. 6.

In the operations of the SAW-less receiver 700, the LNA 710 performs an amplification operation and mixing operation upon a differential input pair Vin to generate a differential output pair $V_{out}$, the LPF 730 filters the differential output pair $V_{out}$ to generate a filtered signal $V_{LP}$, and the ADC 740 performs an analog-to-digital converting operation upon the filtered signal $V_{LP}$ to generate a digital signal $V_D$ to the digital processor 750.

The digital processor 750 can detect the power of the in-band signal at the digital domain and send the information $P_d$ of the power of the in-band signal to the detect and control circuit 760. The detect and control circuit 760 can generate at least one control signal Vc to control the gains of the Gm cells Gm1 and Gm2 according to the information $P_d$ of the power of the in-band signal. That is, if the power of the in-band signal is too low, the detect and control circuit 760 generates the control signal Vc to increase the gains of the Gm cells Gm1 and Gm2 shown in FIG. 6; and if the power of the in-band signal is too high, the detect and control circuit 760 generates the control signal Vc to decrease the gains of the Gm cells Gm1 and Gm2. In addition, when the Gm cells Gm1 and Gm2 are adjusted, the detect and control circuit 760 also generates another control signal Vc to adjust the gains of the assistant Gm cells Gmc1 and Gmc2 to make the noise of the first assistant signal VPA be equal to the noise of the first processed signal $V_P'$, and to make the noise of the second assistant signal $V_{NA}$ be equal to the noise of the second processed signal $V_N'$.

In addition, when the differential input pair $V_{in}$ includes blocker(s), the amplifiers A1 and A2 may be saturated and the linearity of the receiver will be worsened. Therefore, the detect and control circuit 760 also detects an out-band power $P_a$ in the analog domain to determine whether the differential input pair $V_{in}$ includes the blocker. For example, the detect and control circuit 760 can detect the power of the differential input pair $V_{in}$, the differential output pair $V_{out}$ or the mixed differential output pair $V_{mix}$ to determine whether the blocker exists in these signals. When the blocker exists in the differential input pair, the detect and control circuit 760 generates the control signal Vc to disable the first assistant circuit 610 and the second assistant circuit 620 (i.e. disable the assistant Gm cells Gmc1 and Gmc2); and when the blocker does not exist in the differential input pair, the detect and control circuit 760 generates the control signal Vc to enable the first assistant circuit 610 and the second assistant circuit 620 (i.e. enable the assistant Gm cells Gmc1 and Gmc2).

In addition, in another embodiment of the present invention, the detect and control circuit 760 can detect a strength of the blocker to generate a detection result, and uses the detection result to generate the control signal Vc to enable or disable the first assistant circuit 610 and the second assistant circuit 620. For example, when the strength/power of the blocker is great (e.g. greater than a threshold), the detect and control circuit 760 generates the control signal Vc to disable the first assistant circuit 610 and the second assistant circuit 620 (i.e. disable the assistant Gm cells Gmc1 and Gmc2); and when strength/power of the blocker is low (e.g. lower than a threshold), the detect and control circuit 760 generates the control signal Vc to enable the first assistant circuit 610 and the second assistant circuit 620 (i.e. enable the assistant Gm cells Gmc1 and Gmc2).

In light of the above, when there is no blocker along with the differential input pair $V_{in}$ or the strength of the blocker is low, the first assistant circuit 610 and the second assistant circuit 620 of the LNA 600/710 are enabled to perform the noise cancellation technique to improve the signal-to-noise ratio (SNR); and when there is a blocker along with the differential input pair $V_{in}$ or the strength of the blocker is great, the first assistant circuit 610 and the second assistant circuit 620 of the LNA 600/710 are disabled to maintain the linearity of the SAW-less receiver 700. Therefore, the SAW-less receiver 700 can always operate appropriately.

The flowchart illustrated in FIG. 5 can also represent a controlling method of the receiver 700 shown in FIG. 7.

Briefly summarized, in the LNA and associated SAW-less receiver of the present invention, the noise carried on two output signals (differential output pair) of LNA are the same; therefore, the noise of the output signals can be cancelled in the following operation. In addition, the assistant circuits of the LNA can be dynamically enabled or disabled to perform the noise cancellation technique or maintain the linearity of the SAW-less receiver by detecting the blocker.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low noise amplifier, comprising:
   a first transconductance cell (Gm cell), for receiving a first input signal to generate a first processed signal;
   a second Gm cell, for receiving a second input signal to generate a second processed signal, wherein the first input signal and the second input signal are a differential input pair of the low noise amplifier;
   a first assistant circuit, for receiving the first input signal to generate a first assistant signal;
   a second assistant circuit, for receiving the second input signal to generate a second assistant signal;
   a first adder, coupled to the first Gm cell and the second assistant circuit, for summing up the first processed signal and the second assistant signal to generate a first output signal; and
   a second adder, coupled to the second Gm cell and the first assistant circuit, for summing up the second processed signal and the first assistant signal to generate a second output signal, wherein the first output signal and the second output signal are a differential output pair of the low noise amplifier.

2. The low noise amplifier of claim 1, wherein the first assistant circuit comprises:
   a first amplifier with a feedback loop, for receiving the first input signal to generate an amplified first input signal; and
   a first assistant Gm cell, coupled to the first amplifier, for receiving the amplified first input signal to generate the first assistant signal; and second assistant circuit comprises:

a second amplifier with a feedback loop, for receiving the second input signal to generate an amplified second input signal; and a second assistant Gm cell, coupled to the second amplifier, for receiving the amplified second input signal to generate the second processed signal.

3. The low noise amplifier of claim 2, wherein the first amplifier and the second amplifier are utilized for adjusting equivalent input resistances of the low noise amplifier.

4. The low noise amplifier of claim 2, wherein a gain of the first assistant Gm cell and a gain of the second assistant Gm cell are scalable.

5. The low noise amplifier of claim 2, wherein the first assistant Gm cell and the second assistant Gm cell are dynamically enabled or disabled.

6. The low noise amplifier of claim 2, wherein the first Gm cell is implemented by a plurality of first Gm sub-cells connected in parallel, the first assistant Gm cell is implemented by a plurality of first assistant Gm sub-cells connected in parallel, and each of the first assistant Gm sub-cells is a replica of each of the first Gm sub-cells; and the second Gm cell is implemented by a plurality of second Gm sub-cells connected in parallel, and the second assistant Gm cell is implemented by a plurality of second assistant Gm sub-cells connected in parallel, and each of the second assistant Gm sub-cells is a replica of each of the second Gm sub-cells.

7. A low noise amplifier, comprising:
a first transconductance cell (Gm cell), for receiving a first input signal to generate a first processed signal;
a second Gm cell, for receiving a second input signal to generate a second processed signal, wherein the first input signal and the second input signal are a differential input pair of the low noise amplifier;
a first assistant circuit, for receiving the first input signal to generate a first assistant signal;
a second assistant circuit, for receiving the second input signal to generate a second assistant signal;
four mixers coupled to the first Gm cell, the second Gm cell, the first assistant circuit and the second assistant circuit, respectively, for mixing the first processed signal, the second processed signal, the first assistant signal and the second assistant signal with four oscillation signals to generate a mixed first processed signal, a mixed second processed signal, a mixed first assistant signal and a mixed second assistant signal, respectively;
a first adder, for summing up the mixed first processed signal and the mixed second assistant signal to generate a first output signal; and
a second adder, for summing up the mixed second processed signal and the mixed first assistant signal to generate a second output signal, wherein the first output signal and the second output signal are a differential output pair of the low noise amplifier.

8. The low noise amplifier of claim 7, wherein the first assistant circuit comprises:
a first amplifier with a feedback loop, for receiving the first input signal to generate an amplified first input signal; and
a first assistant Gm cell, coupled to the first amplifier, for receiving the amplified first input signal to generate the first assistant signal; and the second assistant circuit comprises:
a second amplifier with a feedback loop, for receiving the second input signal to generate an amplified second input signal; and
a second assistant Gm cell, coupled to the second amplifier, for receiving the amplified second input signal to generate the second processed signal.

9. The low noise amplifier of claim 8, wherein the first amplifier and the second amplifier are utilized for adjusting equivalent input resistances of the low noise amplifier.

10. The low noise amplifier of claim 8, wherein a gain of the first assistant Gm cell a gain of the second assistant Gm cell are scalable.

11. The low noise amplifier of claim 8, wherein the first assistant Gm cell and the second assistant Gm cell are dynamically enabled or disabled.

12. The low noise amplifier of claim 8, wherein the first Gm cell is implemented by a plurality of first Gm sub-cells connected in parallel, the first assistant Gm cell is implemented by a plurality of first assistant Gm sub-cells connected in parallel, and each of the first assistant Gm sub-cells is a replica of each of the first Gm sub-cells; and the second Gm cell is implemented by a plurality of second Gm sub-cells connected in parallel, the second assistant Gm cell is implemented by a plurality of second assistant Gm sub-cells connected in parallel, and each of the second assistant Gm sub-cells is a replica of each of the second Gm sub-cells.

13. A SAW-less receiver, comprising:
a low noise amplifier, for amplifying a differential input pair to generate a differential output pair, comprising:
a first transconductance cell (Gm cell), for receiving a first input signal to generate a first processed signal;
a second Gm cell, for receiving a second input signal to generate a second processed signal, wherein the first input signal and the second input signal form the differential input pair;
a first assistant circuit, for receiving the first input signal to generate a first assistant signal;
a second assistant circuit, for receiving the second input signal to generate a second assistant signal;
a first adder, coupled to the first Gm cell and the second assistant circuit, for summing up the first processed signal and the second assistant signal to generate a first output signal; and
a second adder, coupled to the second Gm cell and the first assistant circuit, for summing up the second processed signal and the first assistant signal to generate a second output signal, wherein the first output signal and the second output signal form the differential output pair; and
a detect and control circuit, for detecting a blocker exists in the differential input pair and generating at least one control signal, which is configured to enable or disable the first assistant circuit and the second assistant circuit, according to a detection result.

14. The SAW-less receiver of claim 13, wherein when the blocker exists in the differential input pair, the detect and control circuit generates the control signal to disable the first assistant circuit and the second assistant circuit; and when the blocker does not exist in the differential input pair, the detect and control circuit generates the control signal to enable the first assistant circuit and the second assistant circuit.

15. The SAW-less receiver of claim 13, wherein the detect and control circuit detects a power in an analog domain to determine whether the blocker exists in the differential input pair or not.

16. The SAW-less receiver of claim 13, further comprising:
a digital processor, coupled to the low noise amplifier and the detect and control circuit, for providing information of a power of an in-band signal in a digital domain to the detect and control circuit;

wherein the detect and control circuit generates at least one control signal according to the information of the power of the in-band signal to adjust gains of the first Gm cell, the second Gm cell, the first assistant circuit and the second assistant circuit.

17. A SAW-less receiver, comprising:
a low noise amplifier, for amplifying a differential input pair to generate a differential output pair, comprising:
 a first transconductance cell (Gm cell), for receiving a first input signal to generate a first processed signal;
 a second Gm cell, for receiving a second input signal to generate a second processed signal, wherein the first input signal and the second input signal are a differential input pair of the low noise amplifier;
 a first assistant circuit, for receiving the first input signal to generate a first assistant signal;
 a second assistant circuit, for receiving the second input signal to generate a second assistant signal;
 four mixers coupled to the first Gm cell, the second Gm cell, the first assistant circuit and the second assistant circuit, for mixing the first processed signal, the second processed signal, the first assistant signal and the second assistant signal with a oscillation signal to generate a mixed first processed signal, a mixed second processed signal, a mixed first assistant signal and a mixed second assistant signal, respectively;
 a first adder, for summing up the mixed first processed signal and the mixed second assistant signal to generate a first output signal; and
 a second adder, for summing up the mixed second processed signal and the mixed first assistant signal to generate a second output signal, wherein the first output signal and the second output signal are a differential output pair of the low noise amplifier; and
a detect and control circuit, for detecting a blocker exists in the differential input pair and generating at least one control signal, which is configured to enable or disable the first assistant circuit and the second assistant circuit, according to a detection result.

18. The SAW-less receiver of claim 17, wherein when the blocker exists in the differential input pair, the detect and control circuit generates the control signal to disable the first assistant circuit and the second assistant circuit; and when the blocker does not exist in the differential input pair, the detect and control circuit generates the control signal to enable the first assistant circuit and the second assistant circuit.

19. The SAW-less receiver of claim 17, wherein the detect and control circuit detects a power in an analog domain to determine whether the blocker exists in the differential input pair or not.

20. The SAW-less receiver of claim 17, further comprising:
a digital processor, coupled to the low noise amplifier and the detect and control circuit, for providing information of a power of an in-band signal in a digital domain to the detect and control circuit;
wherein the detect and control circuit generates at least one control signal according to the information of the power of the in-band signal to adjust gains of the first Gm cell, the second Gm cell, the first assistant circuit and the second assistant circuit.

\* \* \* \* \*